(12) United States Patent
Kang et al.

(10) Patent No.: US 11,460,775 B2
(45) Date of Patent: Oct. 4, 2022

(54) METHOD AND SYSTEM FOR PREVENTION OF METAL CONTAMINATION BY USING A SELF-ASSEMBLED MONOLAYER COATING

(71) Applicant: Tokyo Electron Limited, Tokyo (JP)

(72) Inventors: Hoyoung Kang, Guilderland, NY (US); Anton J. Devilliers, Clifton Park, NY (US); Corey Lemley, Troy, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/560,776

(22) Filed: Sep. 4, 2019

(65) Prior Publication Data

US 2020/0073244 A1 Mar. 5, 2020

Related U.S. Application Data

(60) Provisional application No. 62/726,605, filed on Sep. 4, 2018.

(51) Int. Cl.
*G03F 7/16* (2006.01)
*B08B 17/02* (2006.01)

(52) U.S. Cl.
CPC .............. *G03F 7/165* (2013.01); *B08B 17/02* (2013.01); *G03F 7/162* (2013.01)

(58) Field of Classification Search
CPC .......... G03F 7/165; G03F 7/162; G03F 7/167; G03F 7/168; B08B 17/02
See application file for complete search history.

(56) References Cited

U.S. PATENT DOCUMENTS

| 6,461,983 | B1 | 10/2002 | Davlin et al. |
| 6,784,120 | B2 | 8/2004 | Davlin et al. |
| 6,946,407 | B2 | 9/2005 | Davlin et al. |
| 7,601,386 | B2 | 10/2009 | Masuda |
| 8,691,331 | B2 | 4/2014 | Santan et al. |
| 9,418,834 | B2 | 8/2016 | Negreira et al. |

(Continued)

FOREIGN PATENT DOCUMENTS

| KR | 10-2016-0098431 A | 8/2016 |
| WO | WO 2010/090772 A1 | 8/2010 |

OTHER PUBLICATIONS

International Search Report and Written Opinion dated May 27, 2020 in PCT/US2019/049508, 12 pages.

(Continued)

*Primary Examiner* — Julia Slutsker
(74) *Attorney, Agent, or Firm* — Oblon, McClelland, Maier & Neustadt, L.L.P.

(57) ABSTRACT

Methods for processing a substrate are provided. The method includes receiving a substrate. The substrate has a front side surface, a backside surface, and a side edge surface. The method also includes forming a first material in a first annular region of the front side surface, resulting in the first annular being coated with the first material. The first annular region is immediately adjacent to a perimeter of the substrate. The first annular region has a first outer perimeter proximate to the perimeter of the substrate and a first inner perimeter away from the perimeter of the substrate. The method also includes forming a second material in an interior region of the front side surface, the second material coating the front side surface without adhering to the annular region.

20 Claims, 4 Drawing Sheets

(56) References Cited

U.S. PATENT DOCUMENTS

| | | |
|---|---|---|
| 2002/0168874 A1 | 11/2002 | Davlin et al. |
| 2004/0157471 A1 | 8/2004 | Davlin et al. |
| 2005/0025880 A1 | 2/2005 | Masuda |
| 2007/0212522 A1* | 9/2007 | Heidari ................. G03F 7/0002 |
| | | 428/141 |
| 2010/0201940 A1 | 8/2010 | Santan et al. |
| 2011/0083607 A1 | 4/2011 | You et al. |
| 2014/0018463 A1* | 1/2014 | Thompson ........... G01N 29/022 |
| | | 522/130 |
| 2015/0170903 A1 | 6/2015 | Negreira et al. |
| 2018/0046086 A1* | 2/2018 | Waller .................... G03F 7/168 |

OTHER PUBLICATIONS

Office Action dated May 7, 2022 in corresponding Chinese Application No. 201980056372.7 (English translation only).

\* cited by examiner

METHOD AND SYSTEM FOR PREVENTION OF METAL CONTAMINATION BY USING A SELF-ASSEMBLED MONOLAYER COATING

CROSS-REFERENCE TO RELATED APPLICATIONS

This application claims the benefit of priority from U.S. Provisional Application No. 62/726,605 filed Sep. 4, 2018, the entire contents of which are incorporated herein by reference.

BACKGROUND OF THE INVENTION

This disclosure relates to microfabrication of semiconductor wafers. Silicon wafers are processed to made integrated circuits and other semiconductor devices. Semiconductor fabrication involves many different steps of depositing, growing, patterning, removal, and cleaning of wafers. Various different materials are added and removed or partially removed, while other materials remain. Various process controls attempt to prevent defectivity and contamination.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

In one aspect, the method includes receiving a substrate. The substrate has a front side surface, a backside surface, and a side edge surface. The method also includes forming a first material in a first annular region of the front side surface, resulting in the first annular being coated with the first material. The first annular region is immediately adjacent to a perimeter of the substrate. The first annular region has a first outer perimeter proximate to the perimeter of the substrate and a first inner perimeter away from the perimeter of the substrate. The method also includes forming a second material in an interior region of the front side surface, the second material coating the front side surface without adhering to the annular region.

In one aspect, the method includes receiving a substrate. The substrate having a front side surface, a backside surface, and a side edge surface. The method also includes forming a first material in a first annular region of the front side surface, resulting in the first annular being coated with the first material, the first annular region being immediately adjacent to a perimeter of the substrate, the first annular region having a first outer perimeter proximate to the perimeter of the substrate and a first inner perimeter away from the perimeter of the substrate; and forming a second material in an interior region of the front side surface, the second material coating the front side surface without adhering to the annular region.

In one aspect, the method includes receiving a substrate, the substrate having a front side surface, a backside surface, and a side edge surface; deposing a fluorinated self-assembled monolayer coating on a peripheral edge of the front side surface of the substrate without dispensing the fluorinated self-assembled monolayer on interior surfaces of the front side surface, the peripheral edge immediately adjacent to a perimeter of the substrate; and depositing a second material on the interior surfaces of the front side surface while spinning the substrate, the spinning causing the second material to cover the front side surface except that the fluorinated self-assembled monolayer preventing the second material from adhering to the peripheral edge of the front side surface.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
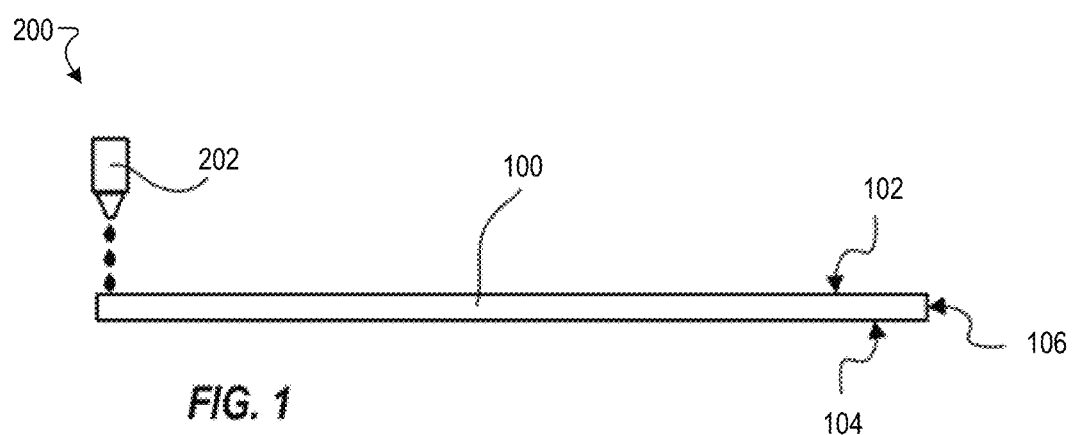
FIG. 1 is a schematic that shows a system for depositing a protective film on a substrate according to one example.

Referring now to the drawings, wherein like reference numerals designate identical or corresponding parts throughout several views, the following description relates to a system and associated methodology for preventing metal contamination by using a self-assembled monolayer coating. Techniques described herein provide coating processes that enable use of metal-containing materials while preventing contamination, defectivity, and unwanted film growth from these materials. Techniques include selectively applying self-assembled monolayers (SAMs) as a blocking layer.

Metal contamination on semiconductor wafers is a particular challenge for applying advanced photo-patternable materials and etch stop layers which contain metals. These metal-containing materials are useful to create high resolution patterns on a wafer, as well as enabling three-dimensional logic, extreme ultraviolet lithography (EUV), and other advanced patterning schemes within optical lithography. Using metal-containing materials, however, is challenging because of a contamination potential.

There are single and multiple module approaches to limit metal contamination by selectively blocking adhesion of metal particles and metal-containing photo materials (e.g., photoresist, back anti-reflective coatings (BARC), metal hardmask (MHM) containing materials) by both additive and subtractive methods. Additional impact to this process attempts to provide a cleaner edge process to improve defectivity at wafer's edge and backside using conventional materials currently available for production.

Conventional techniques to control edge and back side defectivity are less effective in preventing material build up. For example, an edge coat creating a sacrificial layer can have defectivity remaining on the wafer. Moreover, less-effective spin-on material coatings can result in an edge coat barrier, which can disrupt coating performance.

Techniques described herein, however, provide coating processes that enable use of metal-containing materials while preventing contamination from these materials. In one embodiment herein, a Teflon-like SAM (self-assembled monolayer) is dispensed directly on a peripheral edge or annular region of the front side of the wafer to be protected from metals and defects. Material can be dispensed using a nozzle positioned over an edge region of the substrate, or edge bead removal hardware can be used.

Certain SAMs can be created as having a non-wetting surface, which prevents adhesion of liquids. Such surfaces can be described as being hydrophobic. Specifically, such surfaces can have a surface contact angle in a range that repels water or otherwise prevents adhesion of water and certain other liquids including some solvents.

Accordingly, techniques herein include methods of forming protective films on selected portions of a semiconductor substrate (wafer). In one embodiment, a particular SAM is coated on the substrate as described further below.

FIG. 1 is a schematic that shows a system 200 for depositing a protective film on a substrate 100 according to one example. The system 200 may include a dispense nozzle 202. The substrate 100 can include a front side surface 102 (i.e., working surface), a backside surface 104, and side edge surface 106. In one example, the substrate 100 is disc-shaped and relatively thin. The dispense nozzle 202 is positioned proximate an edge region 108 of the front side surface 102. The system 200 may also include a substrate holder (not shown) and/or a rotation chuck that secures and may rotate the substrate, a processing chamber, and a controller configured to control one or more components of the system 200.

Figure 2:
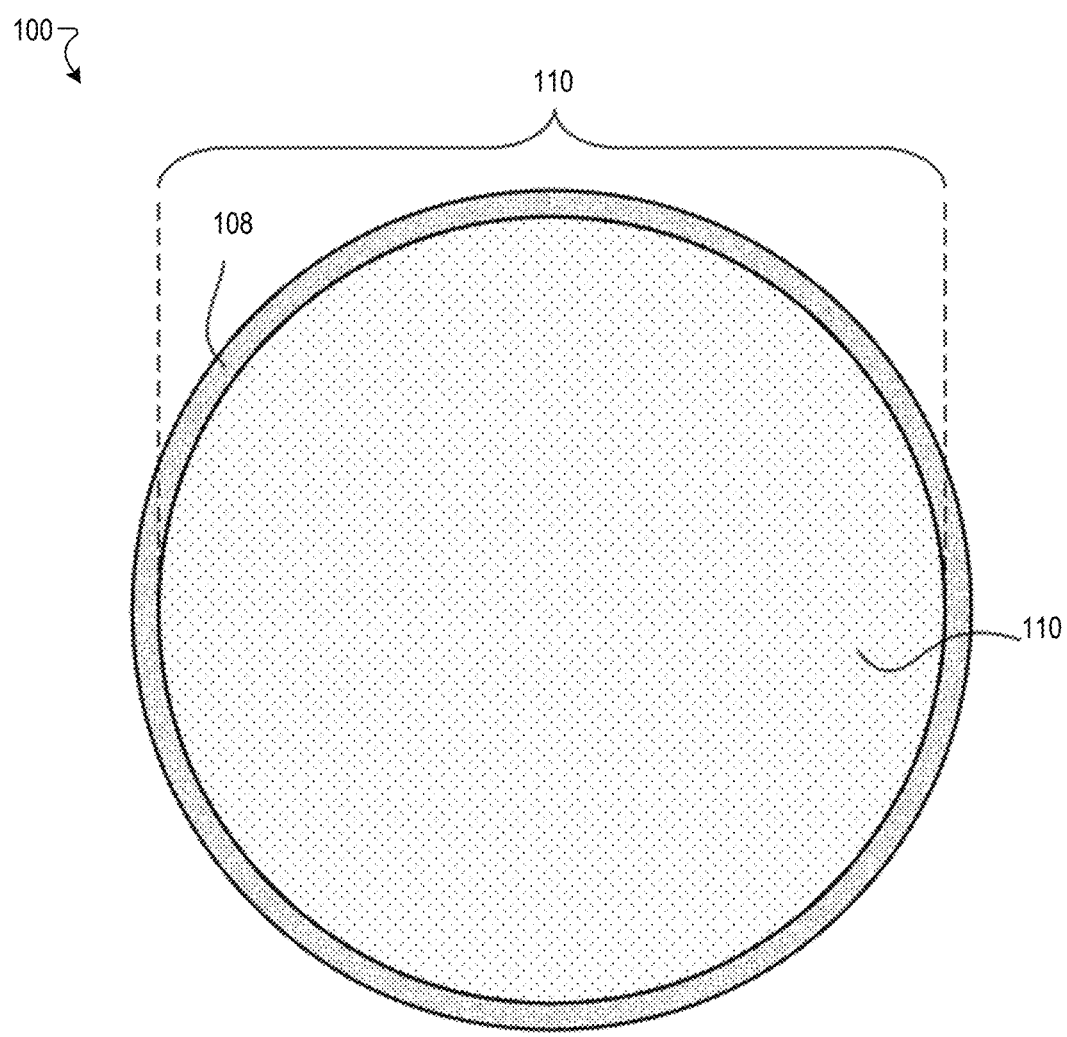
FIG. 2 is a schematic that shows the substrate according to one example.

A top view of the substrate 100 is shown in FIG. 2. The edge region 108 of the front side surface 102 is an annular region extending from a perimeter of the front side surface a predetermined distance towards a center point of the front side surface. The predetermined distance may be in the range of 1 mm to 5 mm. This annular region or first annular region can be immediately adjacent to a perimeter of the substrate. The first annular region has a first outer perimeter proximate to the perimeter of the substrate and a first inner perimeter away from the perimeter of the substrate. In one example, the edge region 108 corresponds to a region where no active device is built. In other words, with a circular shaped substrate, a nozzle is positioned above or at the outer edge, that is, the outer circumferential surface.

Nozzles and apparatus for edge bead removal can be used for dispense nozzles herein. An edge bead is a layer of thicker material that builds up at an edge of the substrate 100 during a coating process. For example, when coating a substrate with photoresist, liquid photoresist is deposited at or near a center point of a spinning wafer. Photoresist then spreads toward the outer edge of the substrate covering the working surface. As photoresist reaches the edge of the substrate, material can build up at the edge. This buildup of material can interfere with subsequent processes and so it is beneficial to remove this bead of photoresist material. Edge bead removal nozzles can dispense or spray solvent on this outer edge to remove the material buildup or entirely remove material from the outer edge. Such hardware can optionally be modified for dispensing coating materials onto the edge of the working surface of substrates.

A first material is then deposited from the dispense nozzle 202 onto the edge region 108 (first annular region) of the front side surface 102 while spinning the substrate 100. This results in the edge region 108 of the substrate 100 being coated with the first material. This first material can be a self-assembled monolayer, fluorinated material (e.g., fluorocarbon layer), or other material resulting in a hydrophobic surface, as described further below. The first material can be deposited as a liquid or as a vapor. This hydrophobic surface will prevent adhesion of subsequent materials. For example, the SAM is formed by a vapor process or a solution process. The front side surface 102 can optionally be cleaned to remove and remaining particles that may not be adhered after the area-selective deposition of the SAM.

In one example, the edge region may have a non-circular shape.

A second material is deposited onto a central region 110 (interior region) of the front side surface 102 while spinning the substrate 100. The second material coats the front side surface 102 without adhering to the edge region 108 or annular region of the front side surface 102. Accordingly, various materials can be deposited without remaining on the edge region 108 of the substrate 100. These materials can include photoresists and metal-containing films. After depositing the second material, the substrate 100 can optionally be cleaned before a next processing step.

Techniques described herein can include controlling amount of SAM deposition as well as SAM removal. Note that various materials can be used for executing the techniques described herein. A photocatalyzation process may be used for SAM removal (e.g., UV cleaving using a 360 nm wavelength). The SAM may be deposited in a monolayer or a bilayer (e.g., a SAM layer followed by another layer of SAM or other material). In addition, a contact angle of the SAM may be varied to alter the interaction between the SAM and the surface of the substrate 100.

Figure 3:
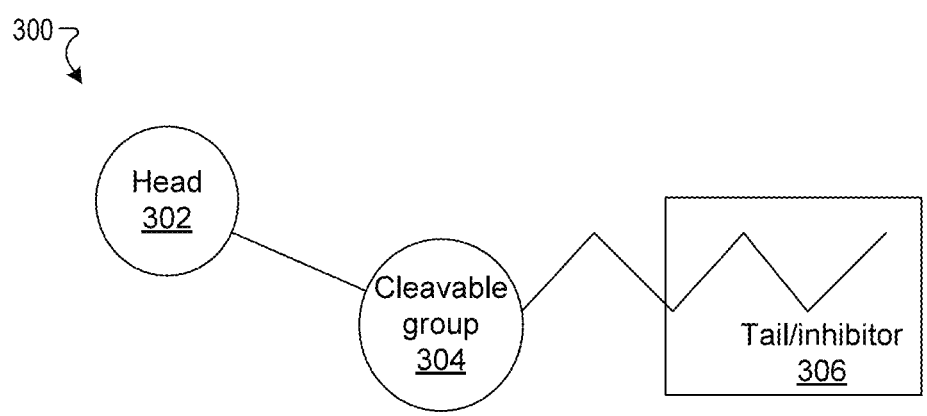
FIG. 3 is a schematic that shows an exemplary self-assembled monolayer (SAM) structure according to one example.

FIG. 3 shows example materials that can be used herein. SAMs 300 are organized assemblies of molecules disposed at an interface between two phases of matters. An example SAM/molecule 300 design can have a head 302 (or head group), a cleavable group 304, and a tail/inhibitor 306 (or tail group). The head 302 is oriented towards the interface, and the tail 306 is oriented away from the interface.

A thickness of a deposited SAM 300 can vary by application. For some applications, a thickness of 0.5 nm to 1.5 nm is preferable.

The head group 302 may be any suitable chemical including Trichloro-Mono-Hydroxy-dithiolane. The cleavable group 304 may be Nitrobenzyl based, Carbonyl based, or Benzyl based. The cleavable group 304 may be selected based on the wavelength.

The tail group 306 may be a relatively long inert, linear hydrocarbon moiety. The tail group 306 includes a fully or partially fluorinated hydrocarbon chain that is oriented away from the interface. The tail group 306 may include alkanes 2-30 carbon long. The tail group 306 may include additional branching and have different shapes.

Figure 4:
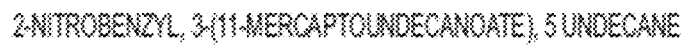
FIG. 4 is a schematic that shows exemplary molecules of SAM according to one example.
Figure 4:
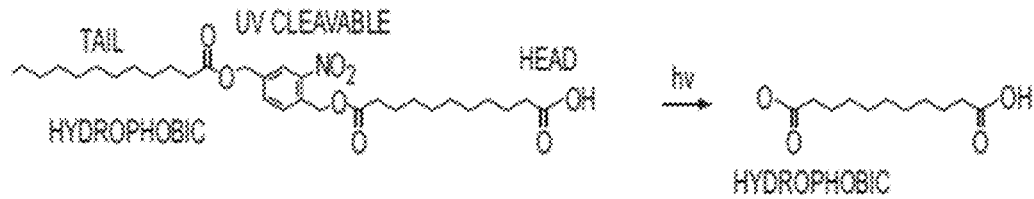
Figure 4:
Figure 4:
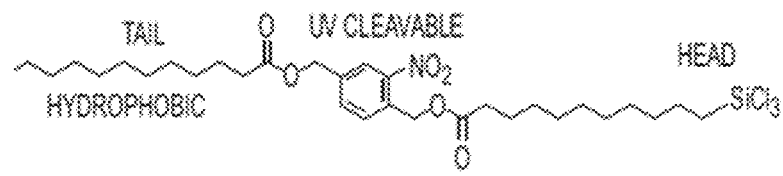
Figure 4:
Figure 4:
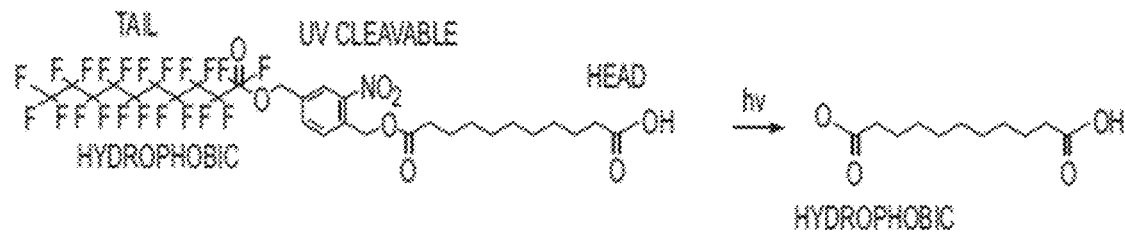
Figure 4:
Figure 4:
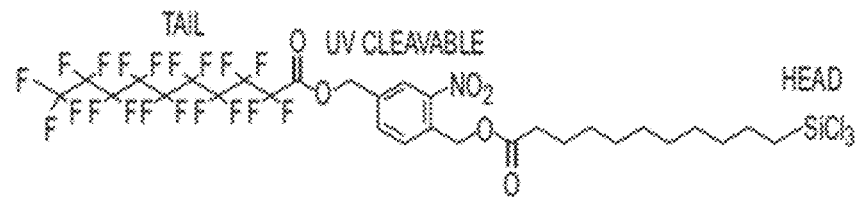

FIG. 4 further illustrates exemplary molecule that can be used herein. Molecules 402 and 404 are hydrocarbon chains. Molecule 402 shows the structure of 2-nitrobenzyl, 3-(11-mercaptoundecanoate), 5 undecane. Molecule 404 is 2-nitrobenzyl-(11-trichlorosilyl)-undecanoate. Molecules 406 and 408 show examples of fluorinated chain. In particular, molecule 406 is 2-nitrobenzyl, 3-(11-fluromercaptoundecanoate), 5 undecane. Molecule 408 is 2-nitrobenzyl-(11-trichlorosilyl)-fluroundecanoate. Synthesis part 1

In one example, 2-nitrobenzyl 11-(trichlorosilyl) undecanoate may be synthesised as described below. The reaction is preferably carried out under dark conditions. For example, an aluminium foil may be used to exclude light from the reaction.

In a first step, 2.0 g (9.9 mmol) of undec-10-enoyl chloride was added to a solution of 1.68 g (10.9 mmol) of (2-nitrophenyl) methanol. The (2-nitrophenyl) methanol solution is obtained by dissolving the methanol in a mixture of 0.88 ml (10.9 mmol) of pyridine and 40 ml of dichloromethane. The reaction was stirred for 48 h at ambient temperature until a complete conversion was observed. The organic layer was extracted with 3×20 mL of 5% hydrochloric acid solution to remove excess pyridine and 20 mL of saturated sodium bicarbonate solution, then dried over sodium sulphate. The solvent was removed in a vacuum and subsequently a column separation using cyclohexane/ethyl acetate (8:1) for product purification was performed. 2.63 g of white soled was obtained in 83% of theoretical yield.

$^1$H-NMR: ($\delta$, 400 MHz, 20° C., CDCl$_3$): 8.05 (dd, 1H, ph$^3$); 7.62 (t, 1H, ph$^4$); 7.57 (d, 1H, ph$^6$); 7.46 (t, 1H, ph$^5$); 5.76 (m, 1H, =CH—); 5.48 (s, 2H, O—CH$_2$-ph); 4.91 (dd, 2H, CH$_2$=); 2.38 (t, 2H, —C2-(COO)); 2.00 (q, 2H, C9); 1.63 (quint, 2H, C3); 1.27 (m, 10H, C4-C8) ppm.

$^{13}$C-NMR: ($\delta$, 125 MHz, 20° C., CDCl$_3$): 172.30 (1C, COO); 147.56 (1C, ph$^2$-NO$_2$); 137.13 (1C, C10(C=C)); 135.20 (1C, ph$^1$); 134.24 (1C, ph$^5$); 128.36 (2C, ph$^{4+6}$); 125.67 (1C, ph$^3$); 115.15 (1C, C11(C=C)); 63.76 (1C, (COO)—CH$_2$-ph); 34.05 (1C, C9); 34.00 (1C, C2); 29.27 (1C, C8); 29.18 (1C, C7); 29.07 (1C, C6); 29.04 (1C, C5); 28.87 (1C, C4); 24.93 (1C, C3) ppm.

In a second step, 1.0 g (7.4 mmol) of trichlorosilane was added to a solution of 1.0 g (3.1 mmol) of (2-nitrobenzylundec-10-enoate, dissolved in 5 ml of dichloromethane. As catalyst hexachloroplatinic acid was used. The reaction was stirred for 24 hrs at ambient temperature until a complete conversion was observed.

Yield: 1.38 g of a white, yellowish liquid (97.3% of theoretical yield).

$^1$H-NMR: ($\delta$, 400 MHz, 20° C., CDCl$_3$): 8.05 (dd, 1H, ph$^3$); 7.59 (t, 1H, ph$^4$); 7.53 (d, 1H, ph$^6$); 7.43 (t, 1H, ph$^5$); 5.48 (s, 2H, (O—CH$_2$-ph)); 2.35 (t, 2H, —C2-(COO)); 1.61 (m, 2H, C3); 1.51 (m, 2H, C10); 1.35 (quint, 2H, C11); 1.28 (m, 12H, C4-C9) ppm.

$^{13}$C-NMR: ($\delta$, 125 MHz, 20° C., CDCl$_3$): 173.12 (1C, COO); 147.64 (1C, ph$^2$-NO$_2$); 133.61 (1C, ph$^6$); 132.23 (1C, ph$^1$); 129.1 (1C, ph$^4$); 128.73 (1C, ph$^5$); 125.01 (1C, ph$^3$); 62.76 (1C, (COO)—CH$_2$-ph); 34.13 (1C, C2); 31.75 (1C, C9); 29.32 (1C, C8); 29.23 (1C, C7); 29.15 (1C, C6); 29.07 (1C, C5); 28.94 (1C, 4); 24.84 (1C, C3); 24.27 (1C, C11); 22.23 (1C, C10) ppm.

IR-Data (CaF$_2$, cm$^{-1}$): 2925; 2853; 1742; 1613; 1578; 1528; 1447; 1343.

Figure 5:
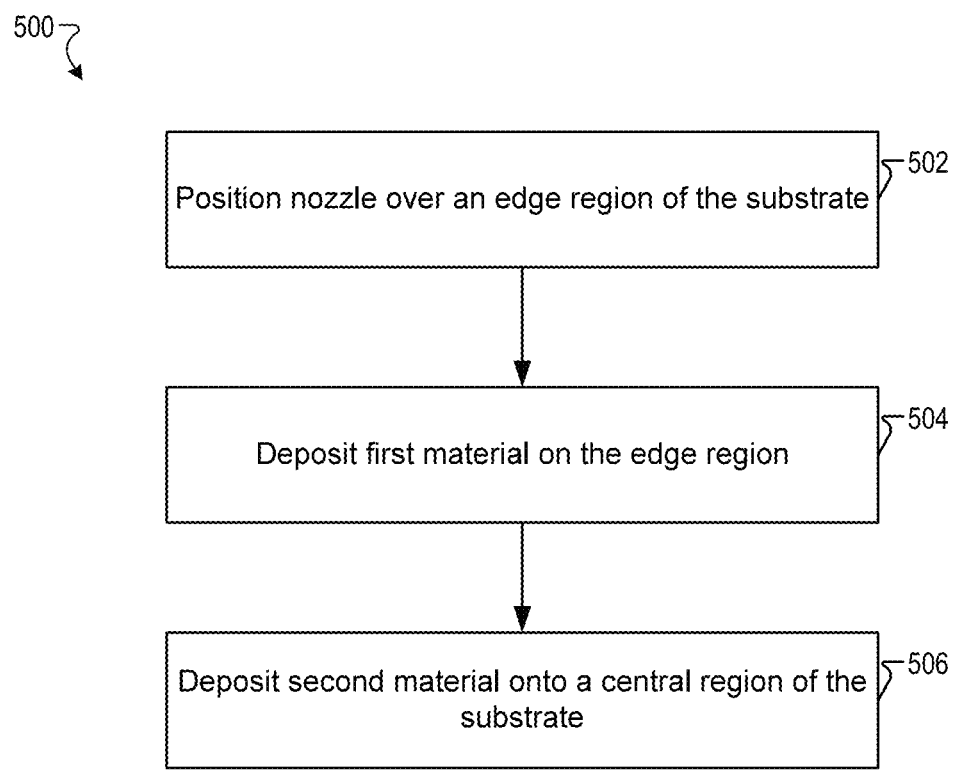
FIG. 5 is a flowchart for a method for prevention of metal contamination by using self-assembled monolayer coating according to one example.

FIG. 5 is a flowchart for a method 500 for metal contamination prevention according to one example. At step 502, a dispense nozzle is positioned proximate to an edge region (e.g., edge region 108 of FIG. 2) of the front side surface of the substrate. In one example, the substrate is prepared for processing. For example, the substrate may be cleaned to remove any contaminants.

At step 504, a first material is deposited from the dispense nozzle onto the edge region of the front side surface of the substrate. The first material may be deposited while spinning the substrate. The rotation speed of the substrate is selected to generate a uniform layer (e.g., between 800 rpm up to 2200 rpm). In one example, the first material is a self-assembled monolayer. The first material may be a fluorinated material. The first material is selected to be hydrophobic. The first material may be dispensed in a liquid or vapor form. For example, a octadecyltrichlorosilane (OTS) or perfluorodecyltrichlorosilane (FDTS) solution is used to form the SAM. The fluorocarbon layer may be formed by plasma enhanced chemical vapor deposition (PECVD) or spin coating.

In one embodiment, the first material is formed in a first annular region of the front side surface of the substrate. The annual region may have a first outer perimeter proximate to the perimeter of the substrate. The substrate may include a second annular region where another material is deposited.

In one example, the front side surface may be cleaned before proceeding to step 506.

In one example, the dispense nozzle may be configured to dispense solvent on an edge portion of the substrate as part of an edge bead removal process.

At step 506, a second material is deposited onto the central region (or interior region) of the front side surface while spinning the substrate. In one example, the second material may be a photoresist and/or a metal-containing film. In one example, the second material may be deposited without spinning the substrate. The second material coats the front side surface of the substrate without adhering to the first annular region or to the edge region of the substrate.

In one example, the substrate is cleaned after step 506.

As described previously herein, subsequent coatings of metal containing material will not adhere to the wafer edge because of the SAM material coated on the edge. In the case of spin cast metal-containing material, droplets that remain will be easily rinsed away with conventional semiconductor solvents, whereas in the case of metal-containing films, the surface is passivated and the surface chemistry required for ALD type reactions will not occur in that location.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of processing a substrate, the method comprising:
   receiving a substrate, the substrate having a front side surface, a backside surface, and a side edge surface;
   positioning a dispense nozzle proximate an edge region of the front side surface, the edge region of the front side surface being an annular region extending from a perimeter of the front side surface a predetermined distance towards a center point of the front side surface;
   depositing a first material from the dispense nozzle onto the edge region of the front side surface and depositing a second material from the dispense nozzle onto the edge region of the front side surface, resulting in the edge region of the substrate being coated with the first and second materials; and
   depositing a third material onto a central region of the front side surface, the third material coating the front side surface without adhering to the edge region of the front side surface,
   wherein the first material and the second material are different.

2. The method of claim 1, wherein the first material is a first self-assembled monolayer.

3. The method of claim 2, wherein a cleavable group of the self-assembled monolayer is Nitrobenzyl based, Carbonyl based, or Benzyl based.

4. The method of claim 1, wherein the first material is a fluorinated material.

5. The method of claim 1, wherein the first material is selected to be hydrophobic.

6. The method of claim 1, wherein the first material is dispensed as a liquid.

7. The method of claim 1, wherein the first material is dispensed as a vapor.

8. The method of claim 1, further comprising cleaning the front side surface subsequent to depositing the first material and the second material and prior to depositing the third material.

9. The method of claim 1, wherein the third material is a photoresist.

10. The method of claim 1, wherein the third material is a metal-containing film.

11. The method of claim 1, wherein the dispense nozzle is also configured to dispense solvent on an edge portion of the substrate as part of an edge bead removal process.

12. The method of claim 1, further comprising cleaning the substrate after depositing the third material.

13. The method of claim 1, wherein the first material, the second material, and the third material are deposited while spinning the substrate.

14. A method of processing a substrate, the method comprising:
   receiving a substrate, the substrate having a front side surface, a backside surface, and a side edge surface;
   forming a first material and a second material in an annular region of the front side surface, resulting in the annular region being coated with the first material and the second material, the annular region being immediately adjacent to a perimeter of the substrate, the annular region having an outer perimeter proximate to the perimeter of the substrate and an inner perimeter away from the perimeter of the substrate; and
   forming a third material in an interior region of the front side surface, the third material coating the front side surface without adhering to the annular region,
   wherein the first material and the second material are different.

15. The method of claim 14, wherein the first material is a self-assembled monolayer.

16. The method of claim 15, wherein the first material is a fluorinated self-assembled monolayer.

17. The method of claim 14, wherein the first material, the second material, and the third material are deposited via a dispense nozzle.

18. The method of claim 17, wherein the first material is dispensed as a liquid.

19. The method of claim 17, wherein the first material is dispensed as a vapor.

20. A method of processing a substrate, the method comprising:
   receiving a substrate, the substrate having a front side surface, a backside surface, and a side edge surface;
   depositing a first material that is fluorinated self-assembled monolayer coating on a peripheral edge of the front side surface of the substrate without dispensing the first material on interior surfaces of the front side surface, the peripheral edge being immediately adjacent to a perimeter of the substrate;
   depositing a second material on the peripheral edge of the front side surface of the substrate without dispensing the second material on the interior surfaces of the front side surface; and
   depositing a third material on the interior surfaces of the front side surface while spinning the substrate, the spinning causing the third material to cover the front side surface and the first and second materials preventing the third material from adhering to the peripheral edge of the front side surface,
   wherein the first material and the second material are different.

* * * * *